United States Patent [19]

Hershberger

[11] Patent Number: 5,164,966
[45] Date of Patent: Nov. 17, 1992

[54] NRZ CLOCK AND DATA RECOVERY SYSTEM EMPLOYING PHASE LOCK LOOP

[75] Inventor: David L. Hershberger, Nevada City, Calif.

[73] Assignee: The Grass Valley Group, Inc., Nevada City, Calif.

[21] Appl. No.: 665,861

[22] Filed: Mar. 7, 1991

[51] Int. Cl.$^5$ .............................. H03L 7/087
[52] U.S. Cl. .................... 375/110; 331/11; 331/DIG. 2; 375/120
[58] Field of Search ............... 375/4, 81, 106, 110, 375/120; 331/1 A, 10, 11, DIG. 2; 329/303, 309, 316; 328/133, 135; 307/269

[56] References Cited

U.S. PATENT DOCUMENTS

| | | | |
|---|---|---|---|
| 4,085,288 | 4/1978 | Viswanathan | 375/120 |
| 4,400,667 | 8/1983 | Belkin | 331/1 A |
| 4,419,633 | 12/1983 | Phillips | 331/DIG. 2 |
| 4,546,486 | 10/1985 | Evans | 375/110 |
| 4,577,241 | 3/1986 | Wilkinson | 375/81 |
| 4,590,602 | 5/1986 | Wolaver | 375/120 |
| 4,803,705 | 2/1989 | Gillingham et al. | 331/11 |
| 4,929,916 | 5/1990 | Fukuda | 331/DIG. 2 |
| 4,949,051 | 8/1990 | Viola | 333/11 |
| 4,972,161 | 11/1990 | Davies et al. | 331/1 A |
| 4,984,255 | 1/1991 | Davis et al. | 375/110 |

*Primary Examiner*—Benedict V. Safourek
*Attorney, Agent, or Firm*—John Smith-Hill

[57] ABSTRACT

An improved NRZ clock and data recovery system lends itself to integration, includes a NRZ phase detector, an NRZ frequency detector and a lock detector, and provides automatic centering of the clock edge within the bit interval in a manner that is independent of analog delays and process and temperature variations. NRZ data is applied to one side of an exclusive-OR gate and a twice delayed version of the NRZ data is applied to the other side. The output of the XOR gate, a "blivet" signal, is applied to a NRZ phase detector comprising two AND gates, one of which has as its other input a recovered clock signal output of a VCO and the other of which has as its other input an inverted version of the recovered clock signal. The "up" and "down" outputs of the AND gates indicate which direction a frequency control signal should change the VCO frequency. A data holding flip-flop whose input is a once delayed version of the NRZ data is clocked with the recovered clock signal. The NRZ frequency detector monitors the state of the recovered clock signal on opposite edges of the blivet to detect too-high, too low and good conditions. The results of the detection can be ignored if a lock signal indicates that the phase lock loop is locked. The lock detector consists of a saturating up/down counter that is incremented by one when good blivets occur and is decremented by four when not-good blivets occur.

37 Claims, 6 Drawing Sheets

NRZ CLOCK AND DATA RECOVERY SYSTEM EMPLOYING PHASE LOCK LOOP

BACKGROUND OF THE INVENTION

This invention relates to digital data transmission, and more particularly to non-return to zero (NRZ) clock and data recovery.

NRZ data does not contain a spectral component at the clock frequency. Therefore, some way must be found to ascertain the clock signal frequency and phase. FIG. 1 shows one prior art approach to this problem. In this approach a non-linearity, in the form of a delay line and an exclusive-OR gate, is introduced to produce a frequency component at the NRZ clock frequency. The delay element is typically one half of the expected bit interval or less. A bandpass filter then detects the introduced frequency component at the clock frequency and either produces a clock directly or produces a clock indirectly with the assistance of a phase lock loop.

The difficulty with the approach shown in FIG. 1 and described above is that a bandpass filter does not lend itself to integration into an integrated circuit (IC), and the phase accuracy of the recovered clock depends on the tuning of the bandpass filter.

Another prior art approach is shown in FIG. 2. This approach does not require a tuned circuit and is therefore more amenable to IC implementation. However, the accuracy of the placement of the clock edge in the center of the bit interval depends primarily on the length of the delay line. In all of the typical IC implementations of a delay line, the amount of delay that results is subject to process and temperature variations. Thus, the clock edge is not well centered within the bit interval and, in the presence of significant jitter, the bit error rate suffers accordingly.

What is desired is an improved NRZ clock and data recovery system that lends itself to integration, that includes a phase and NRZ frequency detector and a lock detector, and that provides automatic centering of the clock edge within the bit interval in a manner that is independent of analog delays and process and temperature variations.

SUMMARY OF THE INVENTION

NRZ data is applied to one side of an exclusive-OR gate and a twice delayed version of the NRZ data is applied to the other side. The output of the XOR gate, a "blivet" signal, is applied to an NRZ phase detector comprising two AND gates, one of which has as its other input a recovered clock signal output of a VCO and the other of which has as its other input an inverted version of the recovered clock signal. The outputs of the two AND gates are an "up" signal and a "down" signal that indicate which direction a frequency control signal should change the VCO frequency. A data holding flip-flop whose input is a once delayed version of the NRZ data is clocked with the recovered clock signal.

In accordance with the invention, there is provided an NRZ frequency detector that includes two flip-flops for monitoring the state of the recovered clock signal on opposite edges of the blivet signal. Three gates monitor the output of the two flip-flops to detect too-high, too-low and "good" conditions. Additional flip-flops hold the results of this detection, and feedback from these flip-flops is used to inhibit detection of error states that are the opposite of an immediately preceding error state. The flip-flops holding the results of the detection can be forced to ignore their inputs and hold a "good" instead if a lock signal indicates that the phase lock loop is locked.

In accordance with the invention there is also provided a lock detector consisting of a saturating up-/down counter that is incremented by one when blivets occur and the NRZ frequency detector is signaling a "good" condition and is decremented by a number larger than one when blivets occur and the NRZ frequency detector is signaling "not-good". A lock signal output is produced whenever the count in the counter is above a predetermined threshold, e.g. half full.

The subject matter of the present invention is particularly pointed out and distinctly claimed in the concluding portion of this specification. However, both the organization and method of operation, together with further advantages and objects thereof, may best be understood by reference to the following detailed description and accompanying drawings.

DETAILED DESCRIPTION

Figure 1:
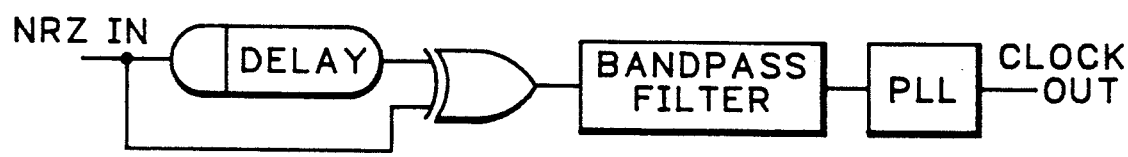
FIG. 1 is a block diagram of a prior art circuit for NRZ clock recovery.
Figure 2:
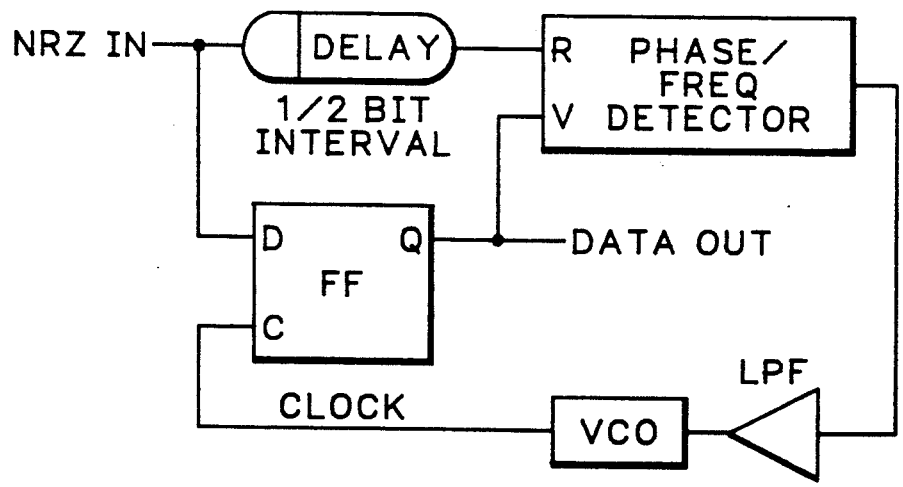
FIG. 2 is a block diagram of another prior art circuit for NRZ clock and data recovery.
Figure 3:
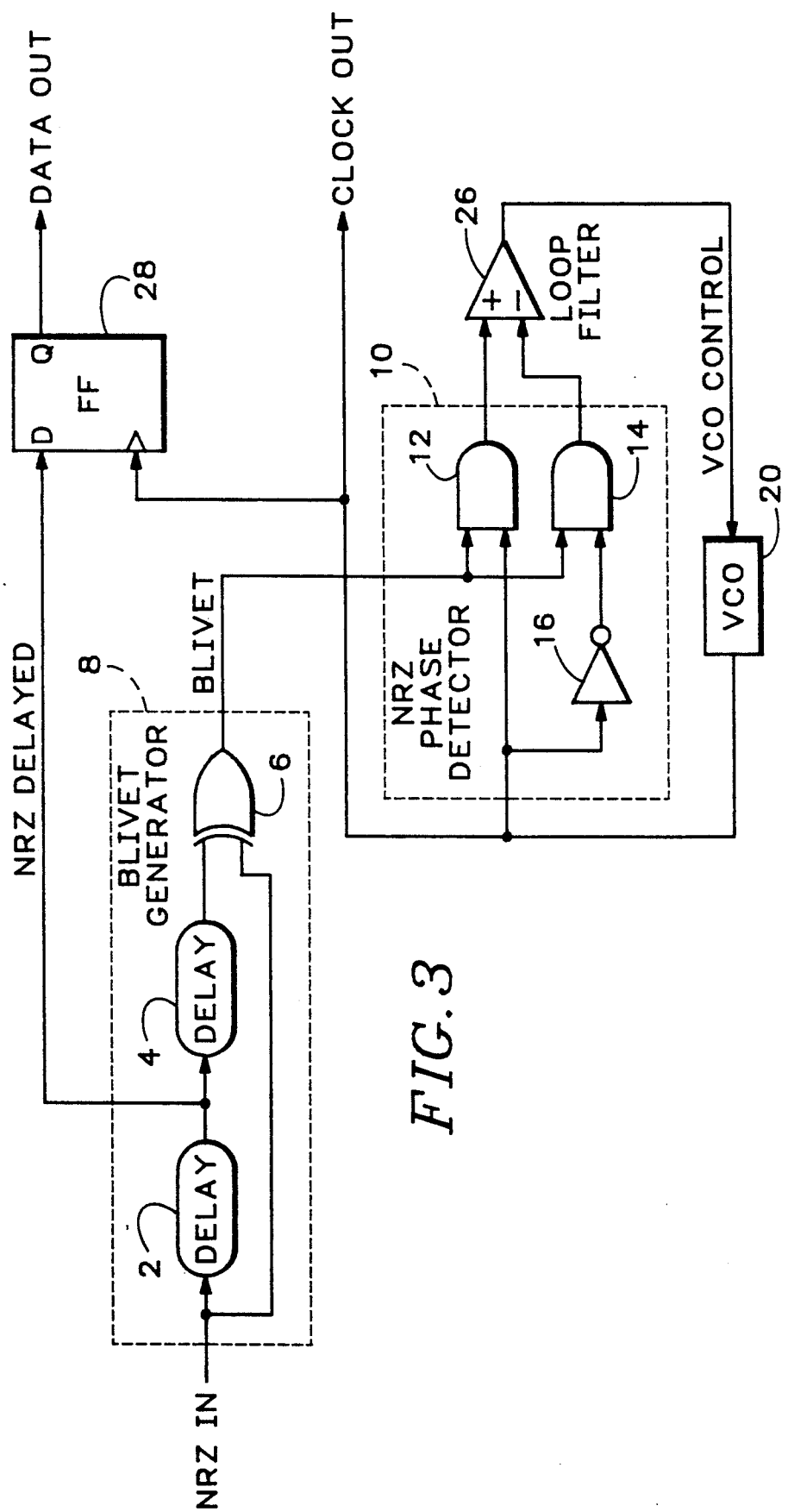
FIG. 3 is a block diagram of a portion of the NRZ clock and data recovery circuit according to the present invention, with schematic details of the phase detection block.

FIG. 3 is a block diagram of a portion of the NRZ clock and data recovery circuit according to the present invention, with an inset schematic detail of the phase detection circuitry 10. This design lends itself to integration and provides automatic centering of the clock edge within the bit interval in a manner that is independent of analog delays and process and temperature variations.

The NRZ data input is applied to a unique "blivet" generator 8. A "blivet" is a pulse indicative of a transition, either low-going or high-going, in the NRZ data. Internal to the blivet generator 8, the NRZ data is applied to one side of exclusive-OR (XOR) gate 6 and also to two matching delay elements 2 and 4 in series, after which the doubly delayed output of those delay elements is applied to the other side of the XOR gate 6. In addition to generating blivets, blivet generator 8 also provides an NRZ output that is delayed by one half of the blivet width.

The blivet output of the blivet generator is a pulse whose duration is the sum of the delay imposed by the two matching delay elements 2 and 4. As will be further explained below, the sum of these delays should be less than one half of the bit interval of the expected data, but as long as possible within that constraint.

The blivet output of the blivet generator 8, from XOR gate 6, is applied to NRZ phase detector 10, which also receives a clock output from a VCO 20. The NRZ phase detector 10 comprises AND gates 12 and 14 and inverter 16. The NRZ phase detector 10 generates two signals, an "up" signal that goes to the "+" input of loop filter 26, and a "down" signal that goes to the "−" input of the loop filter 26. The "up" and "down" signals are used by the loop filter 26 to produce the control voltage for VCO 20. The loop filter 26, which is suitably a charge pump, receives the "up" and "down" pulses from the NRZ phase detector 10 and integrates their difference into an analog VCO control signal with only low frequency components.

As will be further explained below, the effectiveness of this invention relies on the centering of the low-going edge of the VCO 20 recovered clock output within this blivet.

If the VCO output low-going edge is already centered within the blivet produced by the XOR gate 6, the duration of the output from AND gate 12 is the same as the duration of the output from AND gate 14, and the inputs to the loop filter 26 cancel, indicating that no frequency adjustment is necessary and the loop filter 26 continues to produce an unchanged VCO control signal.

If the downward transition of the VCO 20 clock signal output is late within the blivet, the output of AND gate 12 has a longer duration than the output of AND gate 14, and the "up" input to the loop filter prevails over the "down" input and the VCO control voltage output of the loop filter 26 increases the VCO frequency to cause the next low-going edge to occur sooner within the blivet interval.

Conversely, if the downward transition of the VCO 20 clock signal is early within the blivet, the output of AND gate 14 has a longer duration than the output of AND gate 12, and the "down" input to the loop filter 26 prevails over the "up" input and the VCO control voltage output of the lowpass filter 26 decreases the VCO frequency to cause the next low-going edge to arrive later in the blivet interval.

It will therefore be seen that regardless of the position of the clock signal relative to the center of the blivet, the NRZ phase detector 10 and loop filter 26 operate over time to force the downward edge of the clock signal from VCO 20 to the center of the blivet interval.

Because the delay elements 2 and 4 are identical, they produce equal delays despite process and temperature variations. Therefore, changes in process or temperature affect the blivet width, which affects the NRZ phase detector's sensitivity, but not its ability to properly detect phase differences. Sensitivity increases with increasing blivet width, because the difference between the widths of the "up" and "down" pulses can be greater.

The clock output of the VCO 20 is also applied to the clock input of flip-flop 28. The D input of flip-flop 28 is connected to receive the once delayed NRZ data output of the blivet generator 8, from the output of delay element 2. In the approach utilized in this invention, the ability to position the clock edge that clocks the data into flip-flop 28 in the center of the "eye" of the bit interval depends on the centering of the opposite clock edge within the blivet, as described above.

The VCO is balanced to have a near perfect 50% duty cycle. So, with the VCO 20 clock output low-going transitions centered in the blivets from XOR gate 6, the high going transitions are guaranteed to occur while the data present at the junction of the two delay elements 2 and 4 is right in the middle of the bit interval. This is because the falling clock edge occurred half of blivet after the end of the last bit interval, and data at this junction is also delayed by one half blivet at the time of the rising clock edge. The D input of flip-flop 28 is connected to this junction between the delay elements 2 and 4 and is clocked by the rising edge of the VCO 20 output clock signals. Thus, the circuit shown in FIG. 3 reliably recovers NRZ clock and data signals and lends itself to integration into an IC.

The circuit shown in FIG. 3 only performs phase detection, not frequency detection. Yet frequency detection permits much more efficient frequency acquisition by a phase lock loop. Consequently, referring now to FIG. 4, a complete system for NRZ clock and data recovery includes all of the circuitry shown in FIG. 3, plus an NRZ frequency detector 50, a lock detector 30 and OR gates 24 and 22 for combining the "up" and "down" outputs of the phase and NRZ frequency detectors before they are presented to the loop filter 26.

Figure 4:
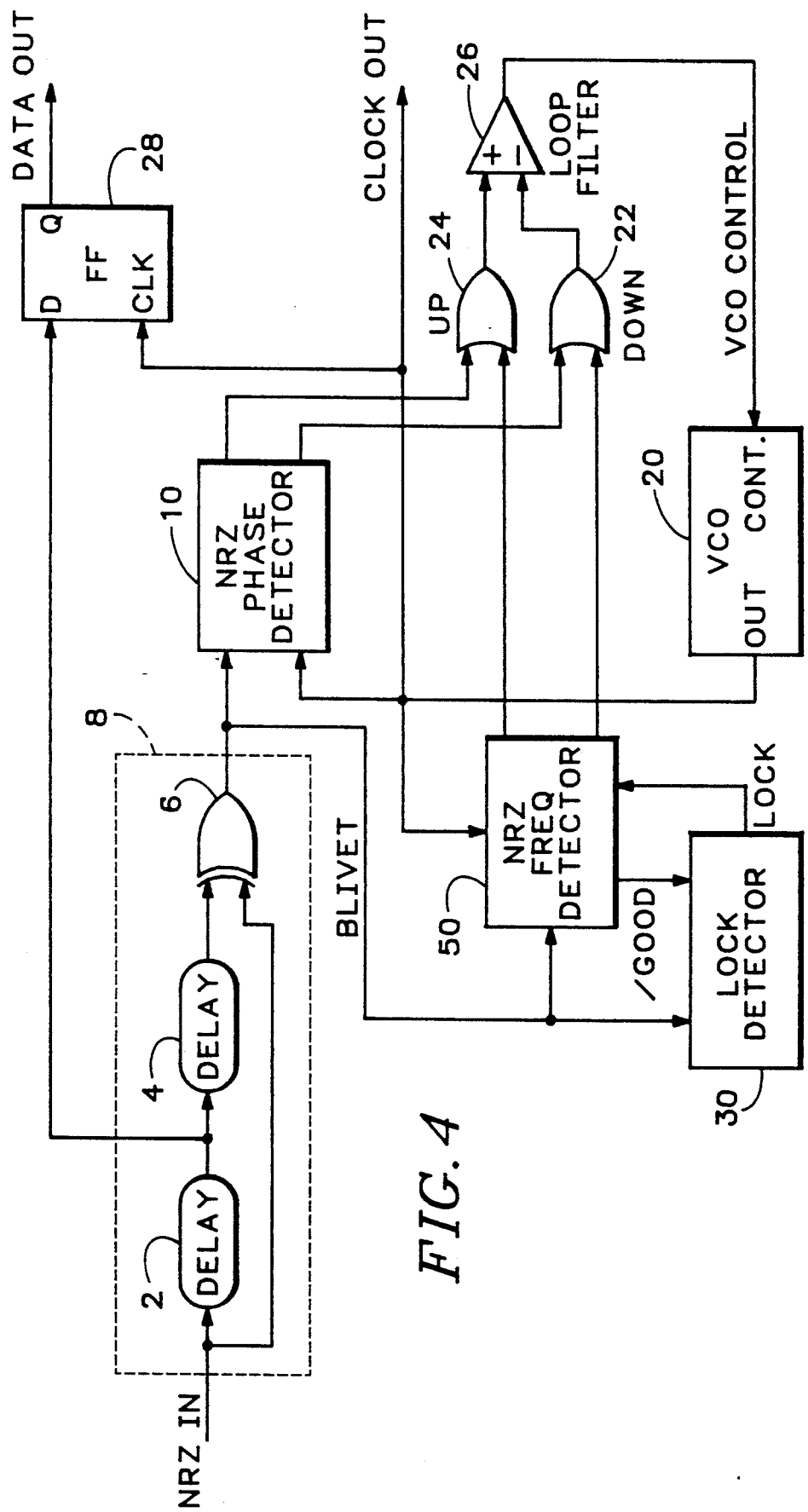
FIG. 4 is a block diagram of the NRZ clock and data recovery system according to the present invention.

In the full system shown in FIG. 4, the blivet signal is supplied to the NRZ frequency detector 50 and the lock detector 30, as to well as the NRZ phase detector 10. The NRZ frequency detector 50 also receives the clock output of the VCO 20 and a "lock" signal from the lock detector 30. Like the NRZ phase detector 10, the NRZ frequency detector 50 produces "up" and "down" signals to steer the VCO 20 via the loop filter 26. These "up" and "down" signals are combined with the "up" and "down" signals from the NRZ phase detector 10 by up OR gate 24 and down OR gate 22. The NRZ frequency detector 50 also produces "not-good" signals that inform the lock detector 30 when the present blivet is going to cause an "up" or "down" signal.

Figure 5:
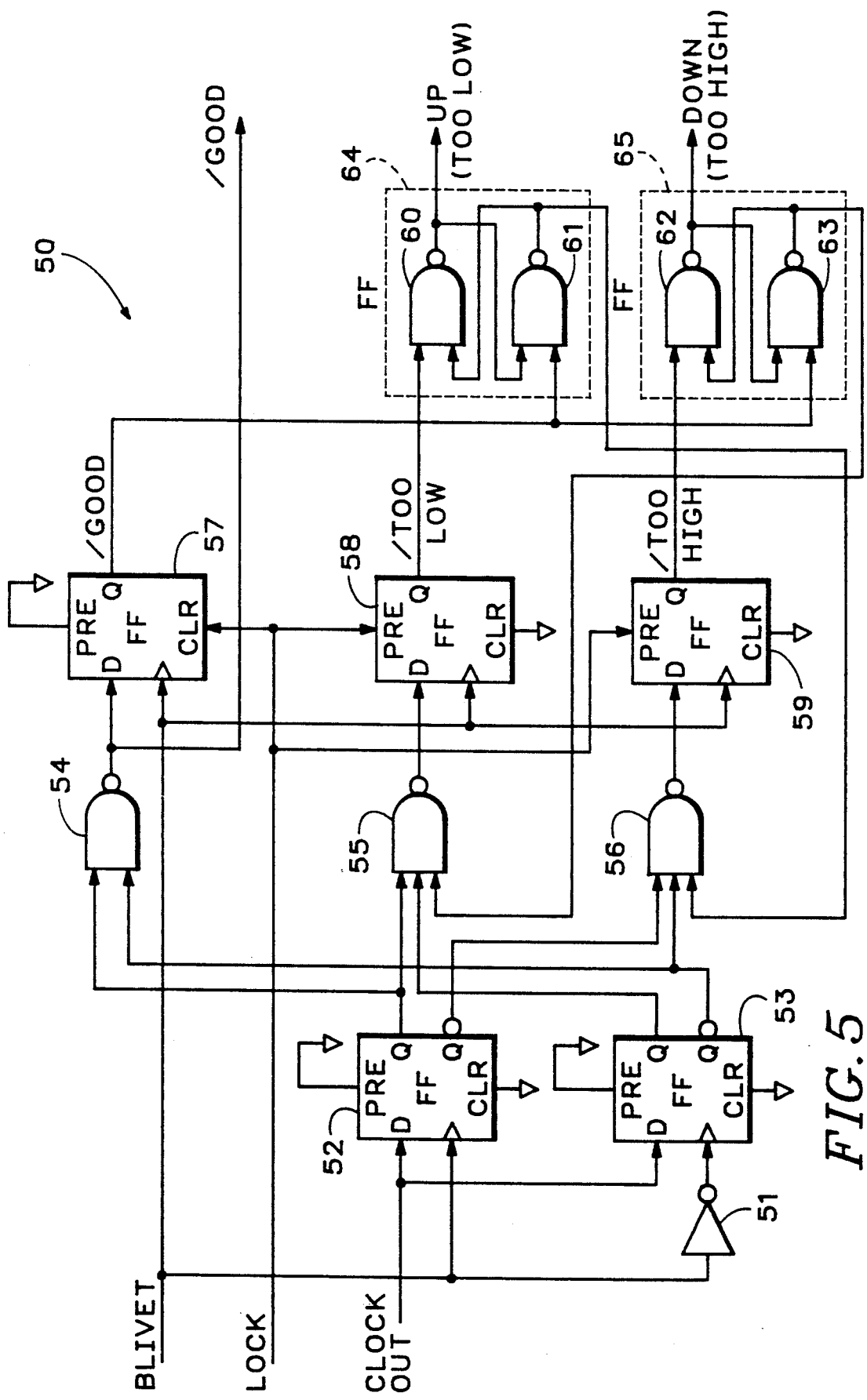
FIG. 5 is a schematic diagram of the NRZ frequency detector according to the present invention.

Referring now to FIG. 5, the NRZ frequency detector 50 contains four flip-flops 52, 57, 58 and 59 that are clocked by the rising edge of the blivet signal and one flip-flop 53 that is clocked by the falling edge of the blivet signal, due to the operation of inverter 51. Flip-flops 52 and 53 monitor the clock output of the VCO 20 on opposite edges of the blivet signal. A "good" blivet is a blivet whose rising edge occurs while the VCO 20 clock out is high and whose falling edge occurs while it is low. A good blivet therefore sets flip-flop 52 and resets flip-flop 53. NAND gate 54 monitors the Q output of flip-flop 52 and the /Q output of flip-flop 53, and produces a low output whenever a good blivet has been detected by these two flip-flops.

The following table summarizes the information inferred by the NRZ frequency detector 50 circuitry from the relationship between the clock output level and the blivet edges:

| CLOCK/BLIVET INFERENCES | | |
|---|---|---|
| High-going Edge (FF52) | Low-going Edge (FF53) | Frequency Inference |
| 1 | 0 | good |
| 1 | 1 | Too Low |
| 0 | 0 | Too High |
| 0 | 1 | Unclear (?) |

NAND gate 55 monitors the states of flip-flops 52 and 53 for the "too-low" condition, i.e., both flip-flops having a high output. The third input to this NAND gate 55 is from the D-C flip-flop created by NAND gates 62 and 63, which produces a high output from NAND gate 62 and a low output from NAND gate 63 when the frequency is too high. The reason for this third input to NAND gate 55 is to prevent going directly from a "too-high" condition to a "too-low" condition without going through a good state in-between. Thus, when the last state out of the NRZ frequency detector was "Down (too-high)", NAND gate 55 is prevented from producing an active-low output indicating that the next state should be "Up (too-low)" by the low output of NAND gate 63.

Similarly, NAND gate 56 monitors the states of flip-flops 52 and 53 for the "too-high" condition, i.e., both flip-flops having a low output. And, in the same way as before, a high output of NAND gate 61 in the other D-C flip-flop, indicating that the last state was not "too-low", is required before an active "too-high" signal can be produced.

The D-C flip-flops 64 and 65, comprising NAND gates 60,61 and 62,63, hold the last known frequency direction, too-low, too-high or neither, until a/good blivet occurs. An active low/good signal attempts to clear both of the D-C flip-flops, and will do so in the absence of an active low/too-low or /too-high signal.

The states of the NAND gates 54, 55 and 56 are clocked into flip-flops 57, 58 and 59, respectively, by the rising edge of the next blivet, if the signal lock is inactive low, indicating that the phase lock loop is not locked. If the signal lock is active high, indicating that a phase lock loop lock has been detected, the signal lock forces the /good flip-flop 57 to its cleared state, producing an inactive high output from that flip-flip, which indicates that the state is "good". The active high lock signal also forces the "too-low" and "too-high" flip-flops to ignore their inputs from NAND gates 55 and 56, respectively, and produce inactive high outputs. Thus, while the loop is locked, the NRZ frequency detector cannot produce any output to disrupt that lock, leaving control entirely up to the NRZ phase detector 10.

Note, however, that even while the loop is locked and the up and down outputs of the NRZ frequency detector 50 are disabled, it can still produce/good (blivet) signal outputs from NAND gate 54. Thus, as will be further explained below, if enough/good blivets are detected, the lock detector 30 can respond by decrementing down to below its one half full level and going to an unlocked condition.

Figure 6:
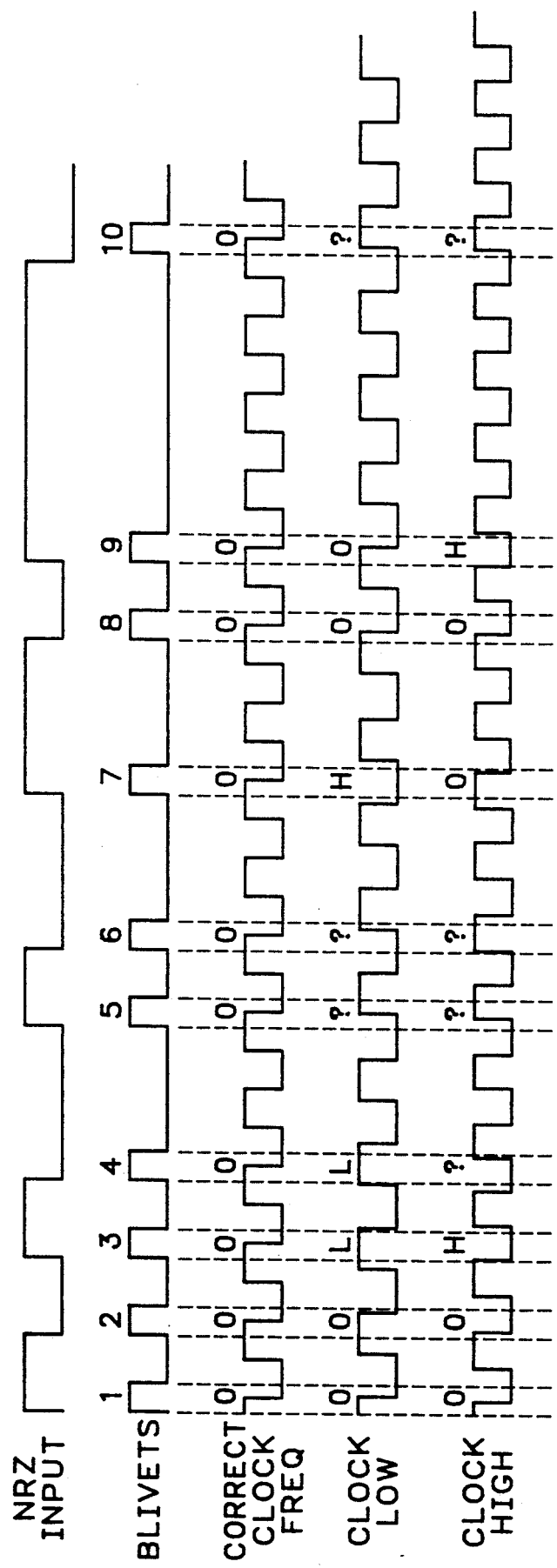
FIG. 6 is a timing diagram illustrating the operation of the NRZ frequency detector according to the present invention.

Referring now to FIG. 6, a series of blivets produces appropriate results in the presence of three different clock frequencies, one correct, one too-high and one too-low. In FIG. 6, good relationships between blivets and clock levels are indicated by "O"s above clock signal, while too low relationships are indicated with an "L" and too-highs with an "H". Unclear results, where the clock is low for the rising blivet edge and high for falling blivet edge, are indicated with a "?".

Everything is simple for the "Correct Clock Freq" line, with each blivet producing a "O". The "Clock Low" line is much more interesting, producing the sequence of relationships: "OOLL??HOO?". The unclear, ?, indications are totally unrecognized by the circuitry shown in FIG. 5, so the "H" at blivet 7 is ignored because the last indication was a "L" and so the output of NAND gate 61 is low disabling NAND gate 56 which would otherwise detect this "H". Even though the "H" is not detected, the failure to satisfy NAND gate 54 because the Q output of flip-flop 52 is low causes the output of NAND gate 54 to go high, and this high is clocked into flip-flop 57 by the next blivet (blivet 8). The continuing high output of flip-flop 57 has no effect on the D-C flip-flops comprising NAND gates 60,61 and 62,63.

The good blivet at blivet 8 is detected by NAND gate 54, whose output goes low in response. The good state of flip-flops 52 and 53 also means that neither of the other NAND gates 55 or 56 are satisfied. The low output of NAND gate 54 is clocked into flip-flop 57 on the rising edge of blivet 9. The same rising clock edge of blivet 9 also clocks the high levels that are present on the output of NAND gates 55 and 56 into flip-flops 58 and 59, respectively. The low output of flip-flop 57 immediately clears the two D-C flip-flops 60,61 and 62,63, so that their outputs on NAND gates 60 and 62 become low, since both of both of their inputs are now high. The cleared states of the D-C flip-flops 60,61 and 62,63 enable the third inputs to NAND gates 55 and 56, allowing them to detect the next high or low state. If the frequency were now correct, mostly good blivets would be detected from now on and the NRZ frequency detector would behave as it does on the line labeled "Correct Clock Freq".

In the absence of jitter, an incorrect frequency will produce indications like those shown in FIG. 6, in which the desired indication always follows a good blivet, and any erroneous indications always follow a desired indication and are locked out by it. In the presence of jitter, however, erroneous indications sometimes follow a good blivet and reach the output. Even in the presence of heavy jitter, though, the desired indications always heavily out-weigh the erroneous ones and the system successfully locks onto the correct frequency.

For the NRZ frequency detector 50 to work correctly, the blivet length has to be less than one half of the bit interval. And, since resistors implemented in silicon and metal capacitors both have tolerances of up to $+/-20\%$, and the delay elements 2 and 4 are based on an RC product of such devices, the worst case delay tolerance could be as bad as $+/-40\%$. Thus, if the delay lines are designed to produce a combined delay of 35% of the bit interval, the worst case deviation still leaves the resulting total delay under half of the bit interval, thereby permitting the NRZ frequency detector 50 to function properly.

Figure 7:
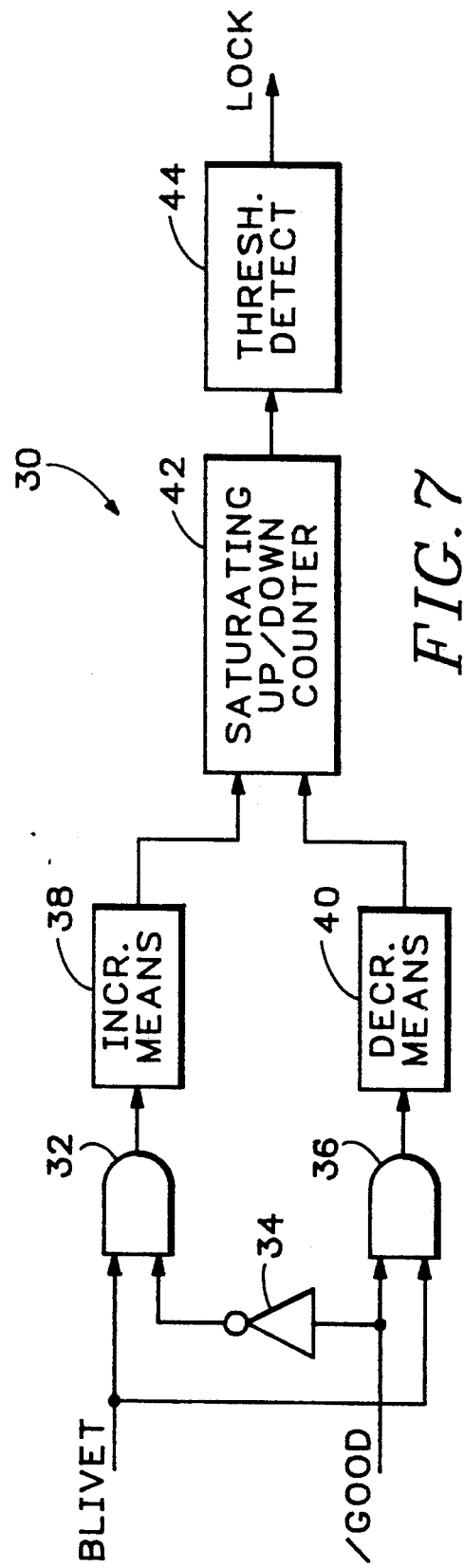
FIG. 7 is a block diagram of the lock detector according to the present invention.

Referring now to FIG. 7, the lock detector 30 receives as its inputs the blivet signal and the/good signal. Counter 42 is a saturating up/down counter. A saturating counter is a counter that does not wrap around; when it reaches a full count, it stays there as additional increment signals are received. The saturating up/down counter 42 is incremented by incrementing means 38 whenever a "good" blivet is detected by AND gate 32, and decremented by decrementing means 40 whenever a "bad" blivet is detected by AND gate 36. Inverter 34 changes the/good signal into a good signal for AND gate 32. When the count in the counter reaches a threshold, for instance, more than half full, a "lock" signal is generated.

The ratio of the increment step size (typically one) to the decrement step size (typically some multiple of increment size) determines the tolerance of the lock detector 30 to jitter. A 1:4 ratio has been found to provide a suitable jitter tolerance. The size of the saturating up/down counter 42 (in bits) determines the integration time of the lock detector 30, and hence its response time to a locked or unlocked condition. There is a trade-off between the speed with which a lock is identified and the certainty of that identification. In the present application, 12 bits of binary, for a total count of 4096, has been found to be a suitable length for this counter, so that a lock indication appears after a count of 2048. If jitter is minimal, a lock is achieved in about 15 microseconds at 270 Megabits per second.

This lock detector 30 implementation is completely digital and therefore does not require an analog integration capacitor and associated IC pin. This is a significant benefit in some applications where a shortage of IC pins is an important design constraint.

Thus, it can be seen that the present invention provides an improved NRZ clock and data recovery system that lends itself to integration, that includes a NRZ phase detector, an NRZ frequency detector and a lock detector, and that provides automatic centering of the clock edge within the bit interval in a manner that is independent of analog delays and process and temperature variations.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

I claim:

1. An NRZ clock recovery system comprising:
   a blivet generator coupled to receive an NRZ input and producing a blivet signal in response to a transition of the NRZ input;
   a controllable oscillator coupled to receive an oscillator control signal and producing a recovered NRZ clock signal;
   a phase detector coupled to receive the recovered NRZ clock signal and the blivet signal and producing an up signal and a down signal;
   a frequency detector coupled to receive the recovered NRZ clock signal and the blivet signal and producing an up signal and a down signal;
   up/up-down/down combining means, coupled to receive the up and down signals from the phase detector and the up and down signals from the frequency detector and producing a combined up signal and a combined down signal; and
   oscillator control means coupled to receive combined up signal and the combined down signal and producing the oscillator control signal.

2. An NRZ clock recovery system according to claim 1, wherein the phase detector comprises:
   first gating means coupled to receive the recovered NRZ clock signal and the blivet signal and producing an up signal while the state of the recovered NRZ clock signal is the same as the state of the blivet signal;
   an inverter coupled to receive the recovered NRZ clock signal and producing an inverted recovered NRZ clock signal; and
   second gating means coupled to receive the inverted recovered NRZ clock signal and the blivet signal and producing a down signal while the state of the inverted recovered NRZ clock signal is the same as the state of the blivet signal.

3. An NRZ clock recovery system according to claim 1, wherein the frequency detector comprises:
   means for determining the states of the clock signal at the times that blivet edges occur; and
   means for ascertaining from the determined states when the frequency of the recovered NRZ clock signal is too low or too high, and producing the up signal when the frequency is too low and the down signal when the frequency is too high.

4. An NRZ clock recovery system according to claim 3, wherein the means for ascertaining comprises:
   up latch means for temporarily holding the up signal;
   down latch means for temporarily holding the down signal; and
   means for preventing production of the up signal when the down latch means is holding a down signal and preventing production of the down signal when the up latch is holding an up signal.

5. An NRZ clock recovery system according to claim 1, wherein the frequency detector includes qualification means for selectively preventing production of the up signal or the down signal.

6. An NRZ clock recovery system according to claim 5, further comprising means for generating a lock signal, and wherein the frequency detector is coupled to receive the lock signal and the qualification means is responsive to the lock signal for preventing production of the up signal or the down signal.

7. An NRZ clock recovery system according to claim 1, wherein the frequency detector further produces a not-good signal indicating that a predetermined relationship between a blivet signal and a clock signal does not exist and wherein the system further comprises:
   a lock detector coupled to receive the blivet signal and the not-good signal and producing a lock signal when the number of blivet signals received bears a predetermined relationship to the number of not-good signals received.

8. An NRZ clock recovery system according to claim 7, wherein the lock detector comprises:
   a saturating up/down counter, the counter incrementing by a first constant in response to each blivet signal and decrementing by a second constant in response to each not-good signal.

9. An NRZ clock recovery system according to claim 7, wherein the frequency detector comprises means responsive to the lock signal for selectively preventing production of the up signal or the down signal.

10. An NRZ data recovery system comprising:
    a first delay element coupled to receive the NRZ input and producing a once delayed NRZ output;
    a second delay element producing a delay substantially equal to that produced by the first delay element, the second delay element being coupled to receive the once delayed NRZ output of the first delay element and producing a twice delayed NRZ output;
    an exclusive-OR gate coupled to receive the NRZ input and the twice delayed NRZ output and producing a blivet signal when the state of the NRZ input is different from the state of the twice delayed NRZ output;
    a controllable oscillator coupled to receive the blivet signal and producing a recovered NRZ clock signal; and
    data recovery means coupled to receive the once delayed NRZ output of the first delay element and the recovered NRZ clock signal and producing a recovered NRZ data output.

11. An NRZ and data recovery system according to claim 10 wherein the data recovery means comprises:

means for holding data having a data input and a clock input, the data input being coupled to receive the once delayed NRZ output and the clock input being coupled to receive the recovered NRZ clock signal, the holding means producing the recovered NRZ data output.

12. An NRZ frequency detector for a phase lock loop circuit that generates a clock signal, the NRZ frequency detector comprising:

a blivet generator coupled to receive an NRZ input and producing a blivet signal in response to a transition of the NRZ input;

means for receiving the blivet signal and the clock signal and determining the states of the clock signal at the times that edges of the blivet signal occur;

means for ascertaining from the determined states when the frequency of the clock signal is too low or too high, and producing a too-low signal when the frequency is too low and a too-high signal when the frequency is too high; and means for adjusting the frequency of the clock signal in response to the signal produced by the means for ascertaining.

13. An NRZ frequency detector according to claim 12, wherein the means for determining comprises:

a first flip-flop having the clock signal as a data input and the blivet signal as a clock input, the first flip-flop producing a first indication signal if the clock signal was high at the time of a first edge of the blivet signal;

an inverter coupled to receive the blivet signal and producing an inverted blivet signal; and a second flip-flop having the clock signal as a data input and the inverted blivet signal as a clock input, the second flip-flop producing a second indication signal if the clock signal was high at the time of a second edge of the blivet signal.

14. An NRZ frequency detector according to claim 13, wherein the means for ascertaining comprises:

first gating means coupled to receive the first indication signal and the second indication signal, it being a necessary condition for production of the too-low signal that the first and second indication signals both be active; and second gating means coupled to receive the first indication signal and the second indication signal, it being a necessary condition for production of the too-high signal that the first and second indication signals both be inactive.

15. An NRZ frequency detector according to claim 12, wherein the means for ascertaining comprises:

first gating means for producing the too-low signal, the first gating means being coupled to receive a first indication signal if the clock signal was high at a time of a first edge of the blivet signal and a second indication signal if the clock signal was high at a time of a second edge of the blivet signal, it being a necessary condition for production of the too-low signal that both the first and second indication signals be active; and second gating means for producing the too-high signal, the second gating means being coupled to receive the first indication signal and the second indication signal, it being a necessary condition for production of the too-high signal that both the first and second indication signals be inactive.

16. An NRZ frequency detector according to claim 15, wherein the means for ascertaining further comprises:

first latch means for holding a previously produced too-low signal; and second latch means for holding a previously produced too-high signal.

17. An NRZ frequency detector according to claim 16 for a phase lock loop circuit with a lock detector for generating a lock signal, wherein the means for ascertaining is coupled to receive the lock signal and the means for ascertaining does not produce the up signal or includes qualification means responsive to the lock signal for preventing production of the too-low signal or the too-high signal.

18. An NRZ frequency detector according to claim 16, wherein the first gating means is operative to prevent production of the too-low signal when the second latch means is holding a too-high signal and the second gating means is operative to prevent production of the too-high signal when the first latch means is holding a too-low signal.

19. A lock detector for a phase lock loop circuit, the lock detector having a first terminal for receiving blivet pulses and a second terminal for receiving not-good pulses indicating that a predetermined relationship between a blivet pulse and a clock pulse does not exit, the lock detector comprising:

a saturating up/down counter;

means for incrementing the counter by a first constant in response to each blivet pulse that is not accompanied by a not-good pulse;

means for decrementing the counter by a second constant in response to each blivet pulse that is accompanied by a not-good pulse; and means for determining if a count in the counter is above a predetermined threshold value and producing a lock signal when the count is above the predetermined threshold.

20. A method for NRZ clock recovery comprising the steps of:

generating a blivet signal in response to a transition of an NRZ input;

producing a recovered NRZ clock signal according to an oscillator control signal;

detecting a phase relationship between the recovered NRZ clock signal and the blivet signal and producing an up signal and a down signal according to the detected relationship;

detecting a frequency relationship between the recovered NRZ clock signal and the blivet signal to produce an up signal and a down signal;

combining the up and down signals from the phase detecting step and the up and down signals from the frequency detecting step to produce a combined up signal and a combined down signal; and producing the oscillator control signal according to the combined up signal and the combined down signal.

21. A method for NRZ clock recovery according to claim 20 wherein the step of detecting a phase relationship comprises:

producing an up output while the state of the recovered NRZ clock signal is the same as the state of the blivet signal; and producing a down signal while the state of an inverted recovered NRZ clock signal is the same as the state of the blivet signal.

22. A method for NRZ clock recovery according to claim 20, wherein the detecting step comprises the steps of:
- determining the states of the recovered NRZ clock signal at the times that blivet edges occur; and
- ascertaining from the determined states when the frequency of the recovered NRZ clock signal is too low or too high, to produce the up signal when the frequency is too low and the down signal when the frequency is too high.

23. A method for NRZ clock recovery according to claim 22, comprising:
- receiving and temporarily holding the up signal provided by the ascertaining step;
- receiving and temporarily holding the down signal provided by the ascertaining step; and
- producing the up signal only when no down signal is being held and producing a down signal only when no up signal is being held.

24. A method for NRZ clock recovery according to claim 20, wherein the frequency detecting step further comprises the
- step of selectively preventing production of the up signal or the down signal.

25. A method for NRZ clock recovery according to claim 24, further comprising the steps of:
- generating a lock signal, and wherein the frequency detecting step is responsive to the lock signal being active to prevent production of the up signal or the down signal.

26. A method for NRZ clock recovery according to claim 20, wherein the frequency detecting step further comprises the steps of:
- generating a not-good blivet; and
- detecting a lock to produce a lock signal when the number of blivet signals received bears a predetermined relationship to the number of not-good blivet signals received.

27. A method for NRZ clock recovery according to claim 26 wherein the detecting a lock step comprises the step of:
- incrementing a saturating up/down counter by a first constant in response to each good blivet signal; and
- decrementing the saturating up/down counter by a second constant in response to each not-good blivet signal.

28. A method for NRZ clock recovery according to claim 26, wherein the frequency detecting step comprises the step of selectively preventing production of the up signal or the down signal in response to the lock signal.

29. A method for NRZ data recovery comprising the steps of:
- delaying once an NRZ input to produce a once delayed NRZ output;
- delaying again the once delayed NRZ output to produce a twice delayed NRZ output, the delaying once step and the delaying again step producing substantially equal delays;
- producing a blivet signal when the state of the NRZ input is different from the state of the twice delayed NRZ output;
- producing a recovered NRZ clock signal; and
- recovering NRZ data from the once delayed NRZ output and the recovered NRZ clock signal to produce a recovered NRZ data output.

30. A method for NRZ data recovery according to claim 29 wherein the recovering step comprises the steps of:
- receiving the once delayed NRZ output from the delaying once step at an input of a means for holding data; and
- clocking the once delayed NRZ output from the delaying once step into the means for holding data using the recovered NRZ clock.

31. A method for NRZ frequency detecting in a phase lock loop circuit that generates a clock signal, the method comprising the steps of:
- generating a blivet signal in response to a transition of an NRZ input;
- determining the states of the clock signal at the times that edges of the blivet signal occur;
- ascertaining from the determined states when the frequency of the clock signal is too low or too high, producing a too-low signal when the frequency is too low and a too-high signal when the frequency is too high; and
- adjusting the frequency of the clock signal in response to the signal produced by the ascertaining step.

32. A method for NRZ frequency detecting according to claim 31, wherein the determining step comprises the steps of:
- producing a first indication signal if the clock signal was high at the time of a first edge of the blivet signal;
- inverting the blivet signal to produce an inverted blivet signal; and
- producing a second indication signal if the clock signal was high at the time of a second edge of the blivet signal.

33. A method for NRZ frequency detecting according to claim 32 wherein the step of ascertaining further comprises the steps of:
- holding a previously produced too-low signal; and
- holding a previously produced too-high signal.

34. A method for NRZ frequency detecting according to claim 33 further comprising the steps of:
- generating a lock signal; and
- not producing the too-low signal or the too-high signal while the lock signal is active.

35. A method for NRZ frequency detecting according to claim 33 wherein the step of ascertaining further comprises the steps of:
- ignoring an apparently high frequency when when the result of the immediately preceding ascertaining step was that the frequency was apparently high; and
- ignoring an apparently high frequency when the result of the immediately preceding ascertaining step was that the frequency was apparently low.

36. A method for NRZ frequency detecting according to claim 31 wherein the step of ascertaining comprises the steps of:
- ANDing a first signal indicating if the clock signal was high at a time of a first edge of the blivet signal with a second signal indicating if the clock signal was high at a time of a second edge of the blivet signal to produce a too-low signal if the first and second indication signals are both active; and
- ANDing an inverted version of the first indicating signal with an inverted version of the second indicating signal to produce a too-high signal if the first and second indicating signals are both inactive.

37. A method of lock detecting for a phase lock loop circuit that generates clock pulses in response to blivet pulses, the method comprising the steps of:

determining whether a predetermined relationship exists between a clock pulse and a blivet pulse and producing a not-good pulse if the relationship does not exist;

incrementing a saturating up/down counter by a first constant in response to a blivet pulse that is not accompanied by a not-good pulse;

decrementing the saturating up/down counter by a second constant in response to a blivet pulse that is accompanied by a not-good pulse; and determining if a count in the saturating up/down counter is above a predetermined threshold value to produce a lock signal when the count is above the predetermined threshold.

* * * * *